(12) United States Patent
Karashima et al.

(10) Patent No.: US 6,768,212 B2
(45) Date of Patent: Jul. 27, 2004

(54) SEMICONDUCTOR PACKAGES AND METHODS FOR MANUFACTURING SUCH SEMICONDUCTOR PACKAGES

(75) Inventors: Akira Karashima, Oita (JP); Margaret Simmons-Matthews, Richardson, TX (US); Sohichi Kadoguchi, Beppu Oita (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/342,989

(22) Filed: Jan. 15, 2003

(65) Prior Publication Data

US 2003/0137033 A1 Jul. 24, 2003

Related U.S. Application Data

(60) Provisional application No. 60/350,354, filed on Jan. 24, 2002.

(51) Int. Cl.[7] .......................... H01L 23/48; H01L 23/52; H01L 29/40
(52) U.S. Cl. ...................... 257/784; 257/783; 438/118; 438/617
(58) Field of Search ................................ 438/118, 617, 438/123, 125; 257/783, 784, 690, 709, 773; 228/180.5

(56) References Cited

U.S. PATENT DOCUMENTS

| | | | | |
|---|---|---|---|---|
| 4,771,330 A | * | 9/1988 | Long | 257/672 |
| 4,907,734 A | * | 3/1990 | Conru et al. | 228/123.1 |
| 5,328,079 A | * | 7/1994 | Mathew et al. | 228/180.5 |
| 5,647,942 A | * | 7/1997 | Haji | 156/281 |
| 6,079,610 A | * | 6/2000 | Maeda et al. | 228/180.5 |
| 6,321,976 B1 | * | 11/2001 | Lo et al. | 228/180.5 |
| 2003/0166333 A1 | * | 9/2003 | Takahashi | 438/617 |

* cited by examiner

Primary Examiner—David A. Zarneke
(74) Attorney, Agent, or Firm—Frederick J. Telecky, Jr.; W. James Brady, III

(57) ABSTRACT

A semiconductor package according to the present invention includes a die attachment area for receiving a die attachment material and a stitch bond area for receiving a wire lead from a die. The stitch bond area is adjacent to said die attachment area on the substrate. Moreover, a stud bump is formed on the substrate for preventing the die attachment material from contacting the stitch bond area when a die is attached to the die attachment area. A method for manufacturing a semiconductor package according to the present invention also is disclosed.

10 Claims, 2 Drawing Sheets

PRIOR ART | LEAD FRAME/MOUNT PAD | NEW

US 6,768,212 B2

SEMICONDUCTOR PACKAGES AND METHODS FOR MANUFACTURING SUCH SEMICONDUCTOR PACKAGES

This amendment claims priority under 35 USC §119(e)(1) of provisional application No. 60/350,354, filed on Jan. 24, 2002.

FIELD OF THE INVENTION

The present invention relates to semiconductor packages and to methods for manufacturing such semiconductor packages.

BACKGROUND OF THE INVENTION

As die sizes increase to include more components (e.g., circuits, transistors, or the like) to provide more functions, and semiconductor package sizes decrease to reduce size and promote a miniaturization of semiconductors, semiconductor packaging manufacturers must contend with reduced operating margins on the substrate between a die attachment area of the substrate, a stitch bond area of the substrate, and a die that is placed on the die attachment area of the substrate. Semiconductor packages may comprise a substrate, which includes a die attachment area for receiving a die, and a stitch bond area adjacent to the die attachment area. The stitch bond area forms a surface for connecting a lead wire from a die to electrical conductors on the substrate, thereby forming an electrical connection between the die and the conductors or conductive balls in the case of a ball grid array on the substrate. The term substrate as used herein may be a lead frame, a laminate substrate, a tape base substrate, or the like. Further, a die attachment material, e.g., a die attachment paste, a die attachment film, or the like, may be placed on a die attachment area of the substrate for securing a die thereto. In known semiconductor packages, the die attachment material may bleed out of the die attachment area when a die is affixed to the die attachment area. Moreover, the die attachment material which bleeds out of the die attachment area may contact or cover the stitch bond area which is adjacent to the die attachment. Such contact may prevent or hinder attachment of wire leads, from the die to the substrate. As a result, an electrical connection may not be formed adequately between the die and the conductors on the substrate. To compensate for the tendency of die attachment material to bleed out from the die attachment area onto the stitch bond area, manufacturers have to reduce the size of a die that is attached to a given die attachment area, or manufacturers have to increase the die attachment area of the substrate for a given die, or both.

A still further problem is that the gold wire used for attaching to the substrate conductors or balls may not easily connect to the lead frame metal conductors or balls in the ball grid array case. This may be due to the conductor material and/or the size of the wire attachment area.

BRIEF DESCRIPTION OF DRAWINGS

The present invention may be more readily understood with reference to the following drawings.

SUMMARY OF THE INVENTION

In accordance with one embodiment of this invention, a semiconductor package is manufactured by forming a bond wire attachment stud bump on die attachment substrate/leadframe to prevent the die attachment material from interfering with stitch bond wire and/or stitch bond attachment area on the substrate when the die attachment material is placed on the die attachment area and a die is attached to attachment area. Moreover, a semiconductor package made according to this method is disclosed.

DETAILED DESCRIPTION OF PREFERRED EMBODIMENTS

Figure 1:
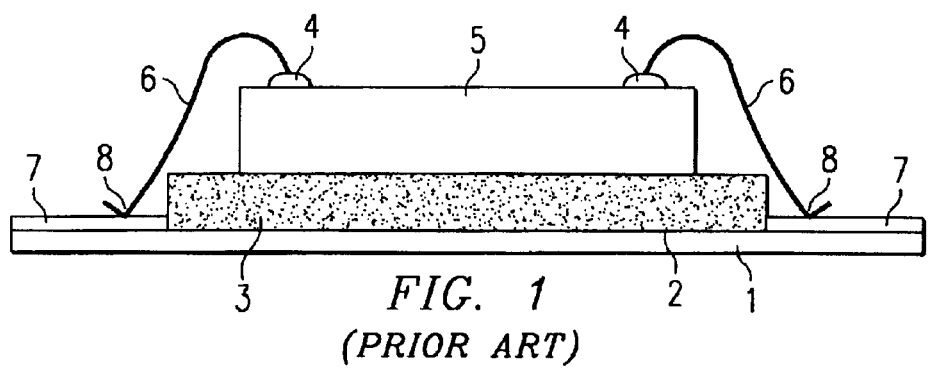
FIG. 1 illustrates an elevation view of a prior art semiconductor package with a film die attach material.

With reference to FIG. 1 there is illustrated a prior art semiconductor package with film die attach material. The substrate 1 has an area 2 to which die attach material 3 is placed to fix the die 5 to the substrate 1. Gold stitch bond wires 6 are connected between die metal on the die 5 and bond areas on conductors 7 located on the top of a substrate and or leadframe 1. A capillary device having a wire extending through a bore in the device forms a gold ball 4 by heat and bonds the gold ball 4 on the die metal to form the first bond. The other end of the wire 6 is then stitch bonded to the bond areas 8 on conductors 7. As illustrated by FIG. 1 the film attach material 3 may squeeze out or bleed out from below the die and interfere with the stitch bond wire 6 and/or the attach bond areas 8 on the substrate 1.

Figure 2:
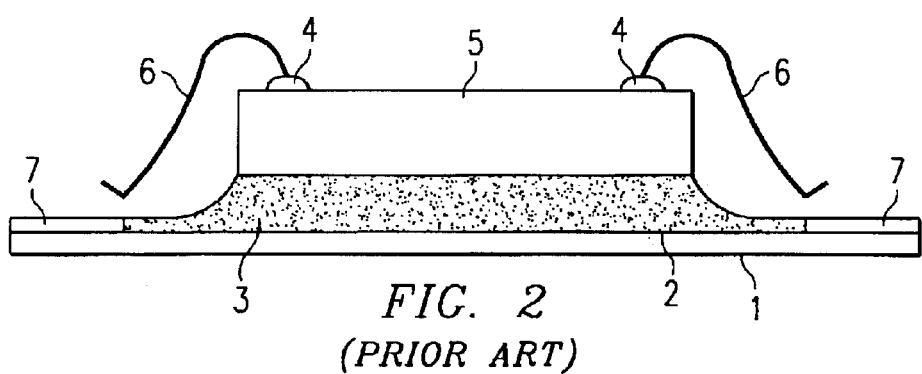
FIG. 2 illustrates an elevation view of a semiconductor package with a paste die attachment material.

FIG. 2 illustrates a second prior art semiconductor package with a semiconductor die attach paste 3 between the die and the substrate 1. The semiconductor paste 3 can likewise interfere with the stitch wire 6 extending from the gold ball 4 and stitch bond area 8 on the substrate 1 as shown.

Figure 3:
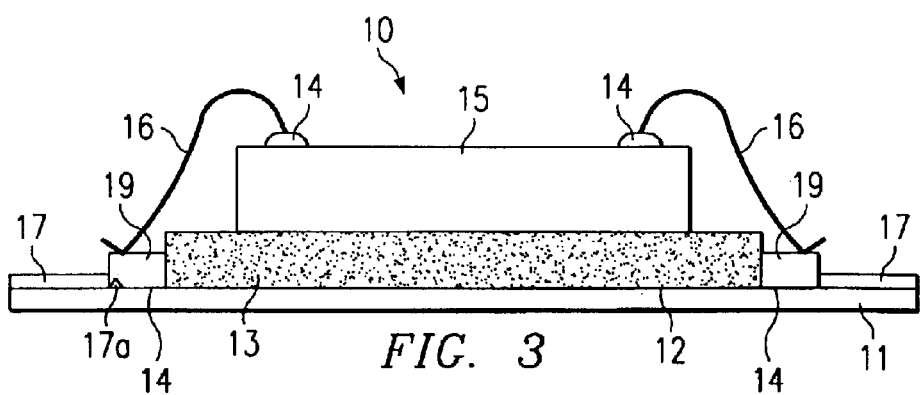
FIG. 3 illustrates an elevation view of a semiconductor package with a die attach film according to one embodiment of the present invention.
Figure 4:
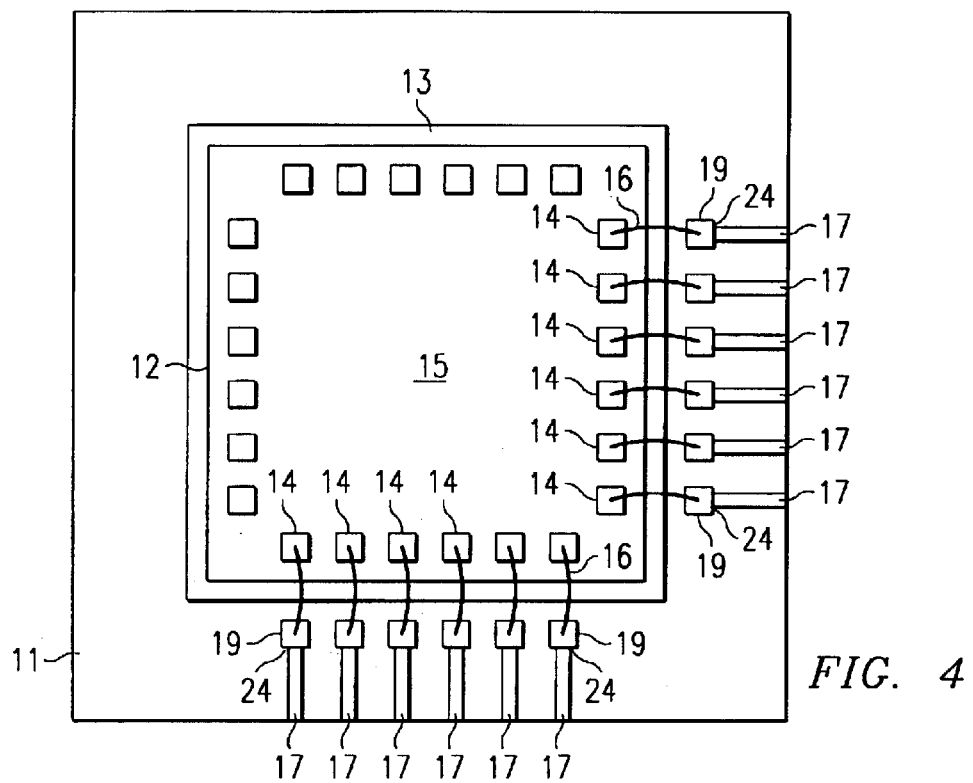
FIG. 4 illustrates a plan view of the embodiment of FIG. 3.

With reference to FIGS. 3 and 4, the semiconductor package 10 of the present invention comprises a substrate 11. The substrate 11 may be a lead frame, a laminate substrate, a tape base substrate, or the like. The substrate 11 comprises a die attachment area 12 for receiving a die attachment material 13 such as a die attachment film, an adhesive or the like for fixing the die 15 to the substrate 11. The substrate 11 in the case of a lead frame has one or more conductors 17 leads on the substrate 11 extending radially away from a stitch bond area or pad 24 located just beyond a die attachment area 12 on the substrate 11. The substrate 11 may also be a ball grid array to be connected to and there are balls in place of the conductors 17 at the stitch bond area or pad 24. The stitch bond area or pad 24 is where a gold bond wire 16 is attached to the conductors 17 on the substrate 11. The semiconductor package 10 further comprises a die 15, which is placed on the die attachment area 12 and affixed thereto by the die attachment material 13.

In accordance with one embodiment of the present invention a gold stud bump 19 is formed on the stitch bond area or pad 24 as shown in FIGS. 3 and 4. The stud bump 19 is of sufficient height to act as a wall to prevent/control unexpected squeeze out/bleed out of die attachment material 13 from interfering with the electrical connection of the gold wire 16 from the gold ball 14 bond on top of the die metal of die 15 to the stitch bond area or pad 24 or the one or more lead conductors 17 or balls on the substrate 11. It further prevents the squeeze out/bleed out from interfering with the gold bond wire 16 or bond area 24. In accordance with one embodiment there would be a gold stud bump 19 for each stitch or bond area 24. The gold stud bump 19 is also of a size to present a good attachment area and material for the gold bond wires 16 to provide an improved connection of the gold bond wires 16 to the gold stud bump 19 and the conductors 17 on the substrate 11. The stud bumps 19 are gold balls of a diameter on the order of two to three times the bond wire 16 diameters. For example for a 1 mil bond wire 16 the stud bumps 19 are balls two to three mils in diameter. In accordance with another embodiment the stud bump 19 is 25 Φm high and 85 Φm in diameter. In accordance with one embodiment of the present invention a capillary device would form the gold ball 14 from an extended part of the gold wire from the capillary device and bond the gold ball 14 to the die metal on top of the die and extend the wire to the stud bump 19 and then stitch the wire 16 to the top of the stud bump 19. The stud bump 19 keeps the stitch wire 16 and the bond area 24 away from the die attachment material 13.

Figure 5:
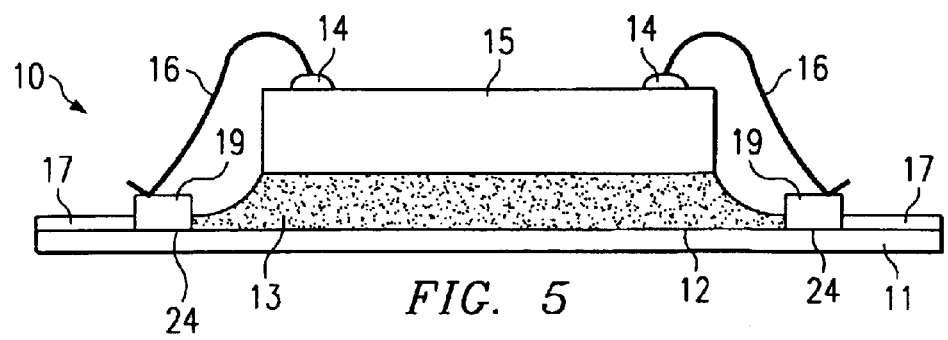
FIG. 5 illustrates an elevation view of a semiconductor package with a die attach paste material according to one embodiment of the present invention.

FIG. 5 illustrates the stud bump attachment according to the present invention where the attachment material 13 is a die attachment paste. A capillary device would form the gold ball 14 from an extended part of a gold wire from the capillary device and bond the gold ball 14 to the die metal on top of the die 15 and extend the gold wire 16 to a stud bump 19 and then stitch the wire 16 to the top of the stud bump 19. The stud bump 19 keeps the stitch wire 16 and the bond area 24 away from the die attachment paste material 13.

Figure 6:
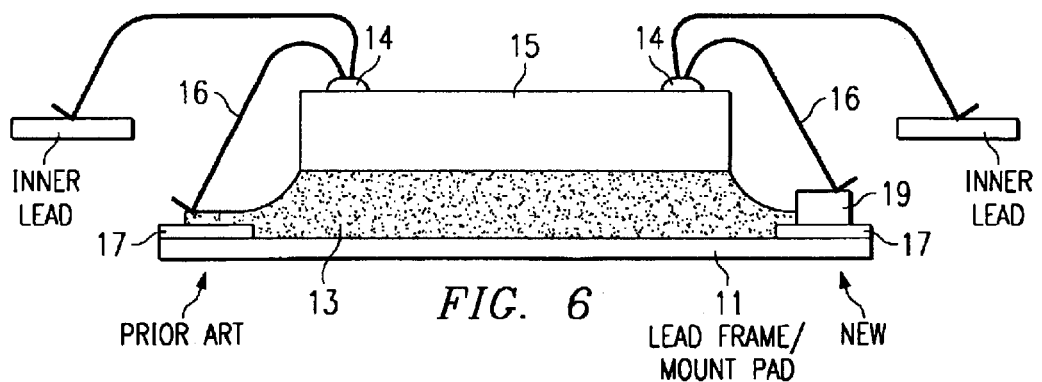
FIG. 6 illustrates an elevation view of die attach material paste material on a lead frame mount pad without the stud bump the left and with the stud bump on the right according to the present invention.

FIG. 6 illustrates die attach material 13 on a lead frame mount substrate or mount pad 11 with a configurations with an inner lead. The left side of the substrate 11 illustrates the prior art without the stud bump 19 and the right side according to the present invention with the stud bump 19. On the left side the die attach material touches the gold wire 16 at the attachment point to the conductor. On the right side the stud bump 19 stops the die attach material from reaching gold wire and the stitch attachment point on top of the stud bump 19.

Figure 7:
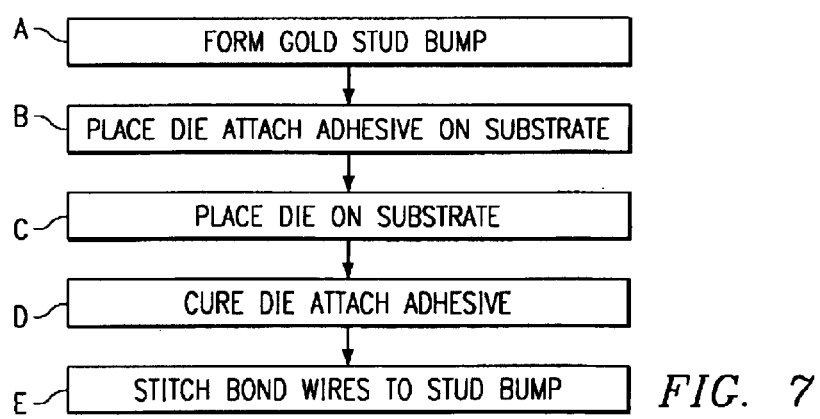
FIG. 7 discloses a method of manufacturing a semiconductor package according to one embodiment of the present invention.

In accordance with an embodiment of the present invention is the process for the structure of FIGS. 3, 4, 5 and right side part of 6. The process may follow the flow chart of FIG. 7 wherein in Step A the gold stud bump 19 is formed or otherwise placed on the bond area or pads 24 on the conductors 17 on the substrate/leadframe 11 before the die attach adhesive material 13 is placed onto the substrate (Step B). This may be done by a standard wire bonder machine. The die 15 in Step C is then placed on the die attachment area 12 and the gold stud bump 19 will act as a wall to prevent/control the unexpected squeeze out/bleed out of the die attach material 13. The next step D is the cure die attach adhesive step to fix the die attach adhesive. The next step E is to stitch bond wires 16 to stud bump 19 as discussed above with a capillary device for example that forms a ball 14 from the gold wire and bonds the ball 14 to the die metal on top of the die 15 and then stitch bonds the gold wire 16 to the stud bump 19 on the conductors 17 on the substrate/ leadframe 11.

Although the present invention has been described in connection with preferred embodiments, the invention is not limited thereto. It is intended that the specification and examples be considered as exemplary only, with the true scope and spirit of the invention being indicated by the following claims. It will be understood by those skilled in the art that other embodiments of the invention, variations and modifications will be apparent to those skilled in the art from a consideration of this specification or a practice of the invention disclosed herein, and may be made within the scope and spirit of this invention, as defined by the following claims.

What is claimed is:

1. A semiconductor package comprising:
   a substrate having a die attachment area for receiving a die attachment material;
   a stitch bond area on said substrate for receiving a wire lead, wherein said stitch bond area is adjacent to said die attachment area; and
   a stud bump at said stitch bond area of said substrate for presenting a barrier wall to prevent said die attachment material from contacting said stitch bond area when a die is attached to said die attachment area.

2. The semiconductor package of claim 1, wherein said stud bump has a diameter at least twice that of the lead wire to present a good electrical connection between said bond wire and said stud.

3. The semiconductor package of claim 2 wherein said stud bump and bond wire are of the same material to provide a good electrical connection.

4. The semiconductor package of claim 3 wherein said material is gold.

5. A method for manufacturing a semiconductor package comprising:
   providing a substrate with a die attachment area and a stitch bond area adjacent said die attachment area;
   forming a bonding stud bump on said substrate adjacent a portion of said die attachment area of said substrate
   placing a die attachment material on said die attachment area;
   attaching a die to said die attachment area, wherein said stud bump prevents said die attachment material from contacting said stitch bond area; and
   attaching a stitch bond wire between said die and said stud bump.

6. The method of claim 5, including the step of curing the die attach material before attaching the stitch bond wire to said stud bump.

7. The method of claim 6, wherein said stud bump is gold and said stitch bond wire is gold.

8. The method of claim 5 wherein the diameter of the stud is at least three times that of the stitch bond wire.

9. The method of claim 5 wherein said attaching step includes bonding the wire at one end of the wire by forming a ball and bonding the ball to the top of said die and at the other end of the wire stitch bonding to the stud bump.

10. A semiconductor package made according to the method of claim 5.

* * * * *